(12) United States Patent
Matsuda

(10) Patent No.: US 9,742,376 B2
(45) Date of Patent: Aug. 22, 2017

(54) ACOUSTIC WAVE DEVICE

(71) Applicant: TAIYO YUDEN CO., LTD., Tokyo (JP)

(72) Inventor: Satoru Matsuda, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 217 days.

(21) Appl. No.: 14/801,496

(22) Filed: Jul. 16, 2015

(65) Prior Publication Data

US 2016/0099705 A1    Apr. 7, 2016

(30) Foreign Application Priority Data

Oct. 3, 2014  (JP) .................................. 2014-205260

(51) Int. Cl.
*H03H 9/17* (2006.01)
*H03H 9/02* (2006.01)

(52) U.S. Cl.
CPC ........ *H03H 9/171* (2013.01); *H03H 9/02102* (2013.01)

(58) Field of Classification Search
CPC ................................ H03H 9/17; H03H 9/171
USPC .................................................. 310/321, 322
See application file for complete search history.

(56) References Cited

U.S. PATENT DOCUMENTS

| | | | | |
|---|---|---|---|---|
| 7,602,101 B2 * | 10/2009 | Hara | ........................ | H03H 3/04 310/320 |
| 7,781,946 B2 * | 8/2010 | Izumi | .................... | B41J 2/14233 310/365 |
| 8,981,627 B2 * | 3/2015 | Sakuma | .............. | H01L 41/0815 310/328 |
| 8,994,251 B2 * | 3/2015 | Kurachi | ............... | B41J 2/14233 310/328 |
| 9,136,820 B2 * | 9/2015 | Aida | .................... | H01L 41/0536 |
| 9,240,769 B2 * | 1/2016 | Sakashita | ................. | H03H 3/02 |
| 9,331,260 B2 * | 5/2016 | Cruz-Uribe | ........... | H01L 41/047 |
| 9,571,061 B2 * | 2/2017 | Shealy | ................... | H03H 9/205 |
| 2003/0080649 A1 | 5/2003 | Araki | | |

(Continued)

FOREIGN PATENT DOCUMENTS

| | | |
|---|---|---|
| JP | 2003-198321 A | 7/2003 |
| JP | 2007-159123 A | 6/2007 |
| JP | 2011-61743 A | 3/2011 |

OTHER PUBLICATIONS

Son et al., "Temperature Compensated Bulk Acoustic Wave Resonator (BAWR) for Near Zero Temperature Coefficient of Frequency (TCF)", Proceedings of the 42nd European Microwave Conference, Oct. 29, 2012-Nov. 1, 2012, p. 100-103.

*Primary Examiner* — J. I San Martin
(74) *Attorney, Agent, or Firm* — Chen Yoshimura LLP

(57) ABSTRACT

An acoustic wave device includes: a substrate; a piezoelectric film located on the substrate; a lower electrode and an upper electrode facing each other across at least a part of the piezoelectric film; a silicon oxide film located at an opposite side of at least one of the lower electrode and the upper electrode from the piezoelectric film; a non-oxygen-containing insulating film located between the at least one of the lower electrode and the upper electrode and the silicon oxide film; and an additional film located at an opposite side of the silicon oxide film from the non-oxygen-containing insulating film and made of a material different from a material of the silicon oxide film.

11 Claims, 14 Drawing Sheets

(56) References Cited

U.S. PATENT DOCUMENTS

2006/0232361 A1\* 10/2006 Wang ................... H03H 3/02
  333/133
2007/0120625 A1   5/2007 Larson, III et al.

\* cited by examiner

US 9,742,376 B2

ACOUSTIC WAVE DEVICE

CROSS-REFERENCE TO RELATED APPLICATION

This application is based upon and claims the benefit of priority of the prior Japanese Patent Application No. 2014-205260, filed on Oct. 3, 2014, the entire contents of which are incorporated herein by reference.

FIELD

A certain aspect of the present invention relates to an acoustic wave device.

BACKGROUND

Piezoelectric thin film resonators using Bulk Acoustic Wave (BAW), which are a type of acoustic wave device, are employed in filters and duplexers of wireless communication devices such as mobile phone terminals. The piezoelectric thin film resonator has a structure designed to have a lower electrode and an upper electrode facing each other across a piezoelectric film. The piezoelectric film typically has a negative temperature coefficient of elastic constant, and thus its resonant frequency and anti-resonant frequency change according to temperature. To reduce the change in frequency due to temperature, there has been suggested using a silicon oxide film having a temperature coefficient of elastic constant opposite in sign to that of the piezoelectric film as a temperature compensation film. For example, Japanese Patent Application Publication No. 2007-159123 suggests using a boron-doped silicon oxide film as a temperature compensation film. For example, Sang Uk Son and 6 others suggest using a multilayered film made of a Low Temperature Oxide (LTO) film and a silicon nitride film as a temperature compensation film in "Temperature Compensated Bulk Acoustic Wave Resonator (BAWR) for Near Zero Temperature Coefficient of Frequency (TCF)", Proceedings of the 42nd European Microwave Conference, October-November, 2012, p. 100-103.

In addition, there has been known providing a silicon nitride film on a silicon dioxide film in a Surface Acoustic Wave (SAW) device, which is a type of acoustic wave device, to prevent moisture absorption of the silicon dioxide film covering a comb-shaped electrode as disclosed in Japanese Patent Application Publication No. 2011-61743. In addition, there has been known providing a silicon nitride film covering a comb-shaped electrode in a SAW device to prevent moisture absorption of the comb-shaped electrode as disclosed in Japanese Patent Application Publication No. 2003-198321.

In the piezoelectric thin film resonator, a silicon oxide film used as a temperature compensation film may be located at the opposite side of at least one of the lower electrode and the upper electrode from the piezoelectric film. When the silicon oxide film, which is located at the opposite side of at least one of the lower electrode and the upper electrode from the piezoelectric film, makes contact with the lower electrode and the upper electrode, the lower electrode and the upper electrode are oxidized by oxygen contained in the silicon oxide film through, for example, a high-temperature reliability test. Moreover, since the silicon oxide film exhibits hygroscopic properties, it absorbs water and causes a change in film quality through, for example, a high-temperature reliability test. These are the causes of the deterioration of the characteristics of the resonator.

SUMMARY OF THE INVENTION

According to an aspect of the present invention, there is provided an acoustic wave device including: a substrate; a piezoelectric film located on the substrate; a lower electrode and an upper electrode facing each other across at least a part of the piezoelectric film; a silicon oxide film located at an opposite side of at least one of the lower electrode and the upper electrode from the piezoelectric film; a non-oxygen-containing insulating film located between the at least one of the lower electrode and the upper electrode and the silicon oxide film; and an additional film located at an opposite side of the silicon oxide film from the non-oxygen-containing insulating film and made of a material different from a material of the silicon oxide film.

DETAILED DESCRIPTION

Hereinafter, a description will be given of embodiments of the present invention with reference to the attached drawings.

First Embodiment

Figure 1:
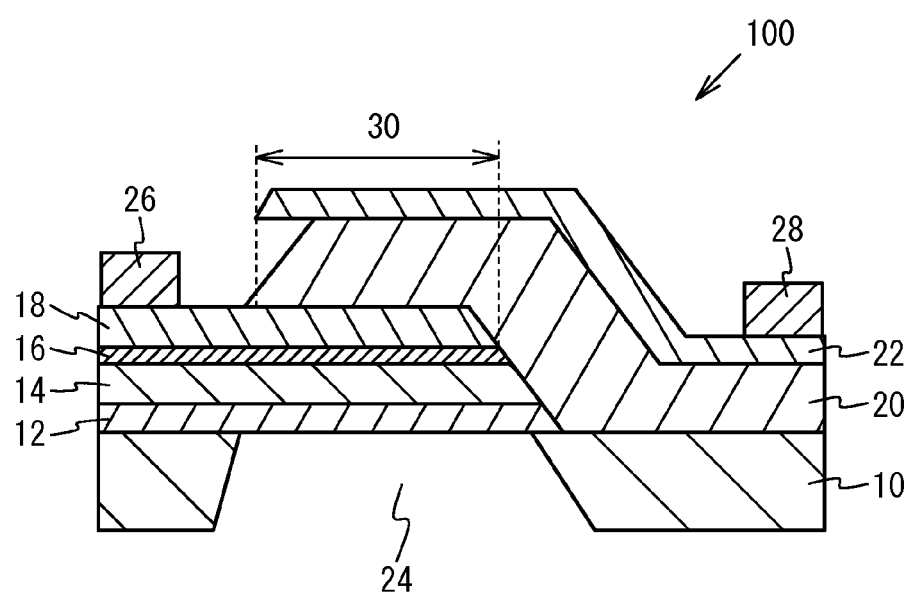
FIG. 1 is a cross-sectional view of a piezoelectric thin film resonator in accordance with a first embodiment.

FIG. 1 is a cross-sectional view illustrating a piezoelectric thin film resonators in accordance with a first embodiment. As illustrated in FIG. 1, a piezoelectric thin film resonator 100 of the first embodiment includes an additional film 12 located on a substrate 10 made of, for example, a silicon (Si) substrate. The substrate 10 may be a quartz substrate, a glass substrate, a ceramic substrate, or a gallium arsenide (GaAs) substrate instead of a Si substrate. On the additional film 12, located is a silicon oxide film 14 functioning as a temperature compensation film. The additional film 12 is located, for example, across the entire lower surface of the silicon oxide film 14. The additional film 12 is, for example, a metal film, and has an acoustic impedance greater than that of the silicon oxide film 14. The additional film 12 is, for example, a chrome (Cr) film. The silicon oxide film 14 is, for example, a fluorine (F)-doped silicon oxide (SiOF) film.

On the silicon oxide film 14, located is an insulating film 16 not containing oxygen. The non-oxygen-containing insulating film 16 is located, for example, across the entire upper surface of the silicon oxide film 14. The non-oxygen-containing insulating film 16 is, for example, a silicon nitride (SiN) film. The non-oxygen-containing insulating film 16 has a thickness less than that of the silicon oxide film 14. A lower electrode 18 is located on the non-oxygen-containing insulating film 16. The lower electrode 18 is, for example, a ruthenium (Ru) film. The silicon oxide film 14 and the lower electrode 18 make no contact with each other due to the non-oxygen-containing insulating film 16 located between them. In addition, the additional film 12 and the lower electrode 18 make no contact with each other and fail to short out due to the silicon oxide film 14 and the non-oxygen-containing insulating film 16, which are located therebetween. Accordingly, the additional film 12 has no electrical contribution to the excitation of an acoustic wave.

On the lower electrode 18 and the substrate 10, located is a piezoelectric film 20 made of an aluminum nitride (AlN) film having a main axis in the (002) direction. The piezoelectric film 20 may be made of zinc oxide (ZnO), lead zirconate titanate (PZT), or lead titanate (PbTiO$_3$) instead of an AlN film. In addition, the piezoelectric film 20 may be mainly composed of AlN, and include other elements to improve the resonance characteristics or to improve the piezoelectricity. For example, the usage of scandium (Sc), magnesium (Mg), hafnium (Hf), zirconium (Zr), or titanium (Ti) as a dopant element improves the piezoelectricity of the piezoelectric film 20, improving the effective electromechanical coupling coefficient of the piezoelectric thin film resonator.

An upper electrode 22 is located on the piezoelectric film 20 so as to have a region (a resonance region 30) facing the lower electrode 18. The upper electrode 22 is, for example, a Ru film. An air-space 24 penetrating through the substrate 10 is located so as to include the resonance region 30. The resonance region 30 has a shape of, for example, an ellipse, and is a region where an acoustic wave in a thickness extension mode resonates. The resonance region 30 may have a shape other than a shape of an ellipse, such as polygonal shape.

A first electrode pad 26 is located to make contact with the upper surface of the lower electrode 18, and a second electrode pad 28 is located to make contact with the upper surface of the upper electrode 22. The first electrode pad 26 and the second electrode pad 28 are, for example, gold (Au) pads.

Figure 2A:
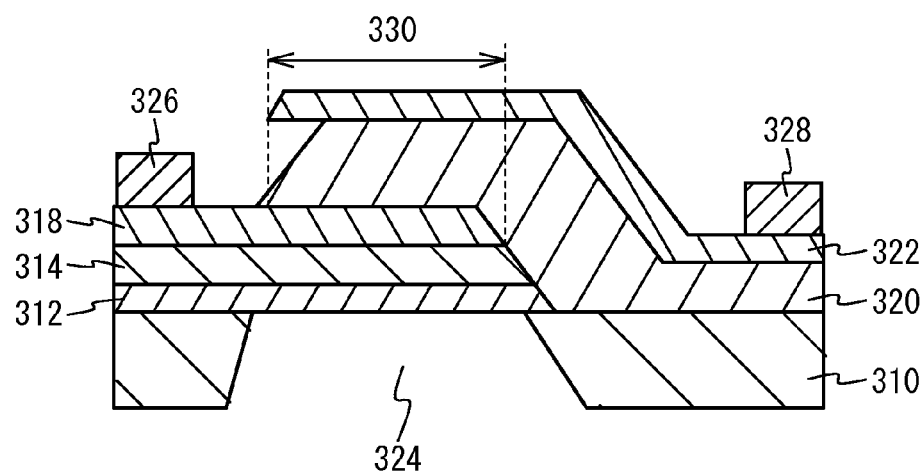
FIG. 2A and FIG. 2B are cross-sectional views illustrating piezoelectric thin film resonators in accordance with a first comparative example and a second comparative example, respectively.
Figure 2B:
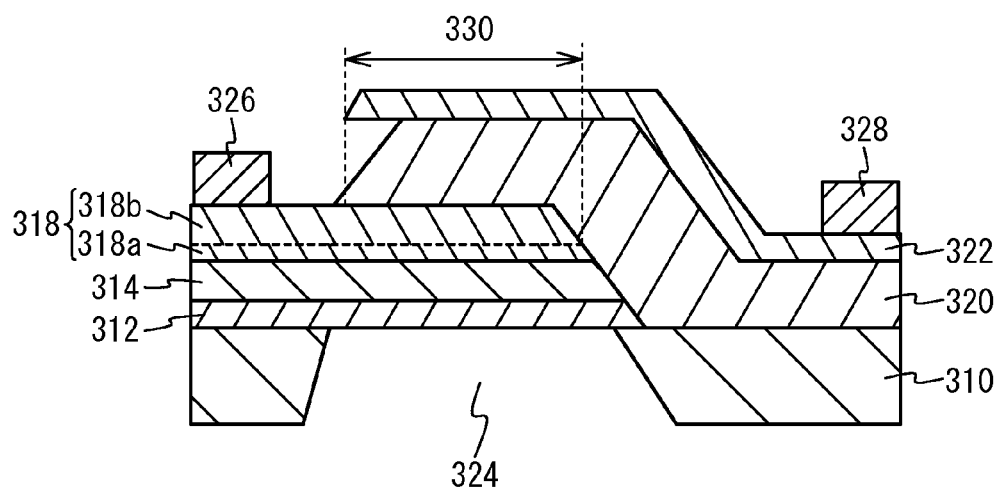

Here, a description will be given of a high-temperature reliability test (100° C., 1000 hours) performed on piezoelectric thin film resonators of first and second comparative examples by the inventor to explain the advantage of the piezoelectric thin film resonator of the first embodiment. FIG. 2A and FIG. 2B are cross-sectional views illustrating piezoelectric thin film resonators in accordance with the first and second comparative examples, respectively.

As illustrated in FIG. 2A, the piezoelectric thin film resonator of the first comparative example includes an additional film 312 located on a Si substrate 310, the additional film 312 being made of a Cr film with a thickness of 100 nm. On the additional film 312, located is a silicon oxide film 314 made of a SiOF film with a thickness of 200 nm and an F concentration of 9 atm %. On the silicon oxide film 314, located is a lower electrode 318 made of a Ru film with a thickness of 160 nm. On the lower electrode 318 and the substrate 310, located is a piezoelectric film 320 made of an AlN film with a thickness of 1200 nm. On the piezoelectric film 320, located is an upper electrode 322 made of a Ru film with a thickness of 230 nm. An air-space 324 penetrating through the substrate 310 is located so as to include a resonance region 330. A first electrode pad 326 made of an Au pad is located on the lower electrode 318, and a second electrode pad 328 made of an Au pad is located on the upper electrode 322.

As illustrated in FIG. 2B, the piezoelectric thin film resonator of the second comparative example differs from the piezoelectric thin film resonator of the first comparative example in that the lower electrode 318 is a metal film formed by stacking a first film 318a made of a Cr film with a thickness of 100 nm and a second film 318b made of a Ru film with a thickness of 160 nm. Other structures are the same as those of the first comparative example illustrated in FIG. 2A, and thus the description is omitted.

Figure 3A:
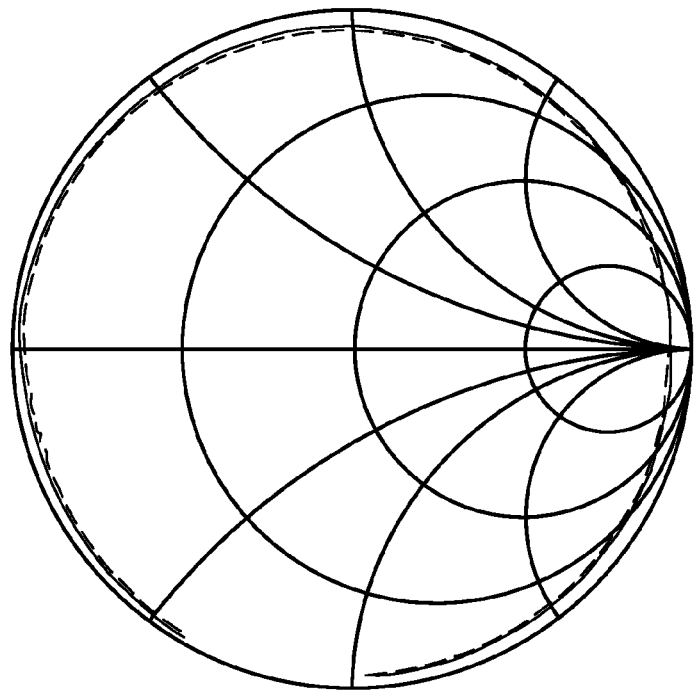
FIG. 3A is a Smith chart of the reflection characteristics of the piezoelectric thin film resonator of the first comparative example before and after a high-temperature reliability test.
Figure 3B:
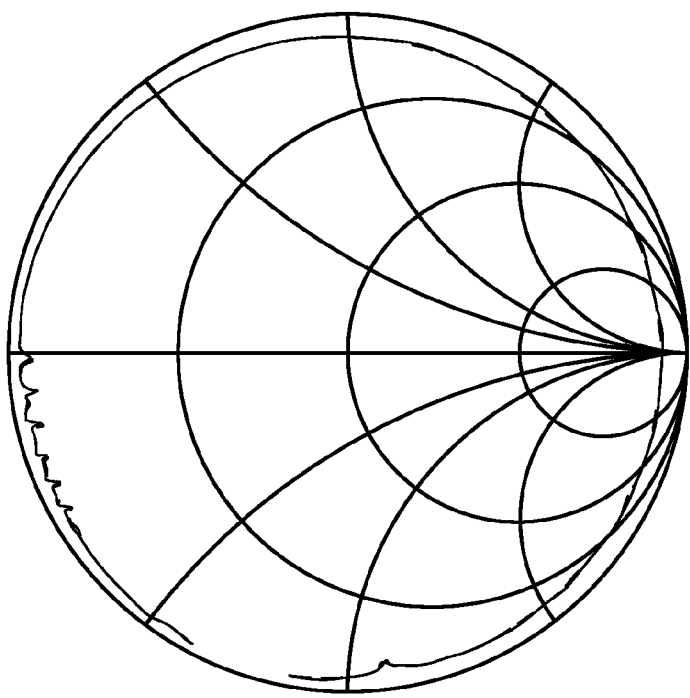
FIG. 3B is a Smith chart of the reflection characteristics of the piezoelectric thin film resonator of the second comparative example before and after a high-temperature reliability test.

FIG. 3A is a Smith chart of the reflection characteristics of the piezoelectric thin film resonator of the first comparative example before and after the high-temperature reliability test, and FIG. 3B is a Smith chart of the reflection characteristics of the piezoelectric thin film resonator of the second comparative example before and after the high-temperature reliability test. In FIG. 3A and FIG. 3B, solid lines exhibit reflection characteristics before the high-temperature reliability test, and dashed lines exhibit reflection characteristics after the high-temperature reliability test.

As illustrated in FIG. 3A, in the piezoelectric thin film resonator of the first comparative example, the characteristics deteriorate due to the high-temperature reliability test. For example, the resonance Q-value is 1090 and the anti-resonance Q-value is 933 before the high-temperature reliability test, while the resonance Q-value deteriorates to 700 and the anti-resonance Q-value deteriorates to 829 after the high-temperature reliability test. On the other hand, as illustrated in FIG. 3B, in the piezoelectric thin film resonator of the second comparative example, although the deterioration of the characteristics is observed after the high-temperature reliability test, the deterioration of the characteristics is reduced compared to the piezoelectric thin film resonator of the first comparative example. For example, the resonance Q-value is 1014 and the anti-resonance Q-value is 788 before the high-temperature reliability test, while the resonance Q-value is 691 and the anti-resonance Q-value is 721 after the high-temperature reliability test.

The reason why the characteristics deteriorate due to the high-temperature reliability test in the piezoelectric thin film resonator of the first comparative example is considered as follows. That is to say, since a Ru film used for the lower electrode 318 is easily oxidized, the lower electrode 318 is oxidized by oxygen contained in the silicon oxide film 314 through the high-temperature reliability test when the lower electrode 318 (Ru film) and the silicon oxide film 314 are located to make contact with each other, and thus the characteristics deteriorate. Moreover, an increase in electrode resistance is observed after the high-temperature reliability test. This also indicates that the lower electrode 318 is oxidized. On the other hand, in the piezoelectric thin film resonator of the second comparative example, the lower electrode 318 is a multilayered film made of the first film 318a made of a Cr film and the second film 318b made of a Ru film, and thus the silicon oxide film 314 makes contact with the first film 318a (a Cr film). The Cr film is not easily oxidized, and thus the oxidization of the lower electrode 318 is prevented. Therefore, the deterioration of the characteristics is reduced.

Taking these factors into consideration, the piezoelectric thin film resonator 100 of the first embodiment includes the non-oxygen-containing insulating film 16 located between the silicon oxide film 14 and the lower electrode 18 as illustrated in FIG. 1. This structure prevents the lower electrode 18 from being oxidized by oxygen contained in the silicon oxide film 14. Moreover, even when a metal film not easily oxidized is used for the first film 318a of the lower electrode 318 as described in the second comparative example of FIG. 2B, a certain degree of oxidization may occur. However, the provision of the non-oxygen-containing insulating film 16 between the silicon oxide film 14 and the lower electrode 18 as described in the first embodiment further prevents the lower electrode 18 from being oxidized. In addition, the silicon oxide film 14 is a material exhibiting hygroscopic properties, and thus absorbs water and causes a change in film quality (e.g., the deterioration of the Q-value) through the high-temperature reliability test. The first embodiment provides the additional film 12 made of a Cr film under the silicon oxide film 14 (i.e., at the opposite side from the non-oxygen-containing insulating film 16). Thus, the first embodiment can prevent the silicon oxide film 14 from absorbing water. Accordingly, the piezoelectric thin film resonator 100 of the first embodiment can reduce the deterioration of the characteristics.

In addition, the piezoelectric thin film resonator 100 of the first embodiment uses a film having an acoustic impedance greater than that of the silicon oxide film 14 for the additional film 12. This allows the silicon oxide film 14 functioning as a temperature compensation film to be located in a part in which the acoustic wave energy is greater. Thus, the silicon oxide film 14 for improving the temperature characteristics can be made to be thin, and the resonance characteristics are thereby improved. When the silicon oxide film 14 is made of a SiOF film, a Ru film and a multilayered film of Cr and Ru are examples of a metal film having an acoustic impedance greater than that of a SiOF film in addition to a Cr film.

As described above, the additional film 12 is preferably a film having a higher moisture resistance than the silicon oxide film 14 and having an acoustic impedance greater than that of the silicon oxide film 14.

In addition, in the piezoelectric thin film resonator 100 of the first embodiment, the non-oxygen-containing insulating film 16 has a film thickness less than that of the silicon oxide film 14. As the thickness of the non-oxygen-containing insulating film 16 increases, the temperature compensation effect by the silicon oxide film 14 decreases. However, good temperature compensation effect can be obtained by making the non-oxygen-containing insulating film 16 have a film thickness less than that of the silicon oxide film 14.

In addition, since the piezoelectric thin film resonator 100 of the first embodiment uses a SiOF film for the silicon oxide film 14, the temperature coefficient of elastic constant of the silicon oxide film 14 can be made large, and thereby the thickness of the silicon oxide film 14 can be made thin. This enables to improve the resonance characteristics. Although a SiOF film especially easily absorbs moisture, the first embodiment provides the additional film 12 under the silicon oxide film 14, thereby preventing water absorption even when the silicon oxide film 14 is a SiOF film.

In the first embodiment, the silicon oxide film 14 is a SiOF film, but may be a SiO film doped with an element other than fluorine (F), or may be a silicon dioxide ($SiO_2$) film not doped with an element other than silicon and oxygen. For example, the silicon oxide film 14 may be mainly composed of silicon oxide, and doped with at least one or more of fluorine (F), hydrogen (H), $CH_3$, $CH_2$, chlorine (Cl), carbon (C), nitrogen (N), phosphorus (P), and sulfur (S). When the silicon oxide film 14 is doped with another element as described above, the temperature coefficient of elastic constant of the silicon oxide film 14 can be made large. Accordingly, the thickness of the silicon oxide film 14 can be made thin, and thereby the resonance characteristics can be improved.

In the first embodiment, the lower electrode 18 is a Ru film, but may be other metal film. For example, the lower electrode 18 may be a single-layer film of chrome (Cr), ruthenium (Ru), aluminum (Al), titanium (Ti), copper (Cu), molybdenum (Mo), tungsten (W), tantalum (Ta), platinum (Pt), rhodium (Rh), or iridium (Ir), or a multilayered film of them. When the lower electrode 18 is made of an easily oxidizable metal, it is preferable to provide the non-oxygen-containing insulating film 16 between the silicon oxide film 14 and the lower electrode 18 as described in the first embodiment. Al, Cu, and Ru are easily oxidizable metals in the above listed metals. The upper electrode 22 may be a metal film other than a Ru film, and may be made of a single-layer film of Cr, Ru, Al, Ti, Cu, Mo, W, Ta, Pt, Rh, or Ir, or a multilayered film of them.

In the first embodiment, the non-oxygen-containing insulating film 16 between the silicon oxide film 14 and the lower electrode 18 is a SiN film, but is not limited to the SiN film. For example, it may be a nitride-based insulating film such as an AlN film, or may contain some oxygen, e.g., oxygen as impurities, that does not cause the oxidization of the lower electrode 18.

Figure 4A:
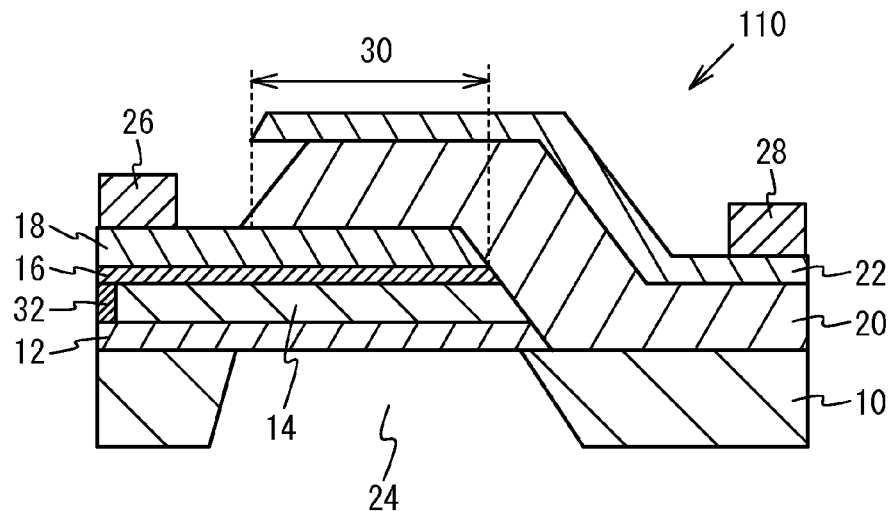
FIG. 4A and FIG. 4B are cross-sectional views illustrating piezoelectric thin film resonators in accordance with first and second variations of the first embodiment, respectively.
Figure 4B:
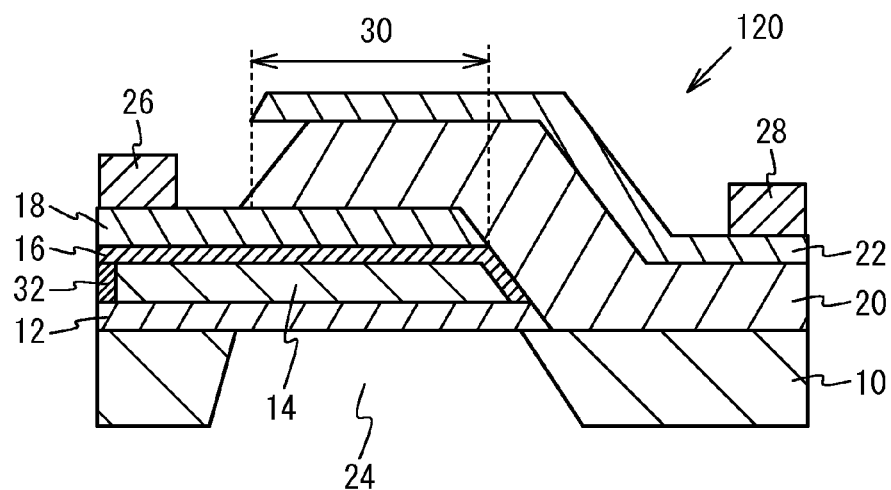

FIG. 4A and FIG. 4B are cross-sectional views illustrating piezoelectric thin film resonators in accordance with first and second variations of the first embodiment, respectively. As illustrated in FIG. 4A, a piezoelectric thin film resonator 110 of the first variation of the first embodiment includes an insulating film 32 located on a first side surface, which is not covered with the piezoelectric film 20, of the side surfaces of the silicon oxide film 14. The insulating film 32 is located, for example, across the entire first side surface, which is not covered with the piezoelectric film 20, of the silicon oxide film 14. The insulating film 32 is made of a material different from that of the silicon oxide film 14, and is made of, for example, a silicon nitride (SiN) film. Other structures are the same as those of the first embodiment illustrated in FIG. 1, and thus the description is omitted.

In the piezoelectric thin film resonator 110 of the first variation of the first embodiment, the insulating film 32 is located on the first side surface, which is not covered with the piezoelectric film 20, of the silicon oxide film 14. This structure further prevents the silicon oxide film 14 from absorbing water, further reducing the deterioration of the characteristics.

The insulating film 32 is preferably located across the entire first side surface, which is not covered with the piezoelectric film 20, of the silicon oxide film 14, but water absorption of the silicon oxide film 14 can be prevented as long as the insulating film 32 is located on at least a part of the first side surface, which is not covered with the piezoelectric film 20, of the silicon oxide film 14. In addition, the insulating film 32 may be made of an insulating film other than a SiN film, and is preferably made of a film having a higher moisture resistance than the silicon oxide film 14. When a material same as that of the non-oxygen-containing insulating film 16 is selected for the insulating film 32, the non-oxygen-containing insulating film 16 and the insulating film 32 can be simultaneously formed.

As illustrated in FIG. 4B, in a piezoelectric thin film resonator 120 of the second variation of the first embodiment, the non-oxygen-containing insulating film 16 is located to extend to a second side surface, which is covered with the piezoelectric film 20, of the side surfaces of the silicon oxide film 14. The non-oxygen-containing insulating film 16 is located, for example, across the entire second side surface, which is covered with the piezoelectric film 20, of the silicon oxide film 14. Other structures are the same as those of the first variation of the first embodiment illustrated in FIG. 4A, and thus the description is omitted.

In the piezoelectric thin film resonator 120 of the second variation of the first embodiment, the non-oxygen-containing insulating film 16 is located to extend to the second side surface, which is covered with the piezoelectric film 20, of the silicon oxide film 14. This structure prevents the piezoelectric film 20 from being oxidized by oxygen contained in the silicon oxide film 14 through the high-temperature reliability test, thus reducing the deterioration of the characteristics.

The non-oxygen-containing insulating film 16 is preferably located across the entire second side surface, which is covered with the piezoelectric film 20, of the silicon oxide film 14, but the oxidization of the piezoelectric film 20 can be prevented as long as the non-oxygen-containing insulating film 16 is located on at least a part of the second side surface, which is covered with the piezoelectric film 20, of the silicon oxide film 14.

Second Embodiment

Figure 5A:
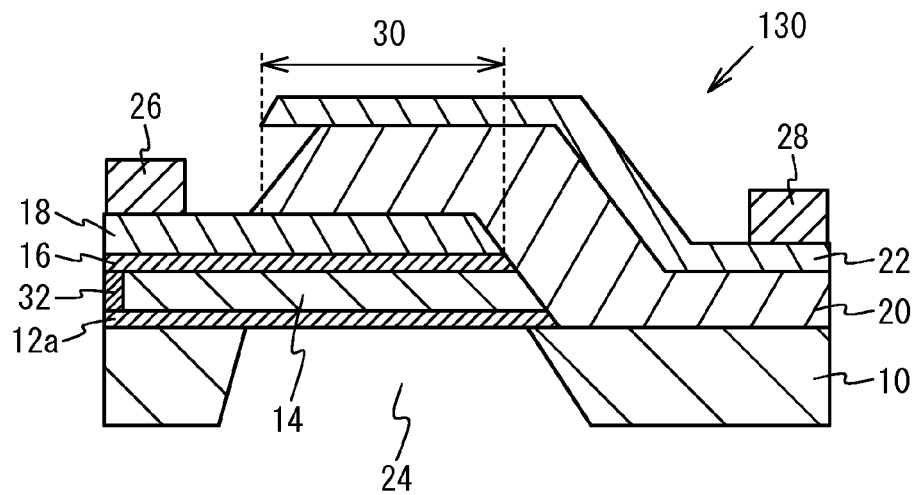
FIG. 5A and FIG. 5B are cross-sectional views illustrating piezoelectric thin film resonators in accordance with a second embodiment and a first variation of the second embodiment, respectively.
Figure 5B:
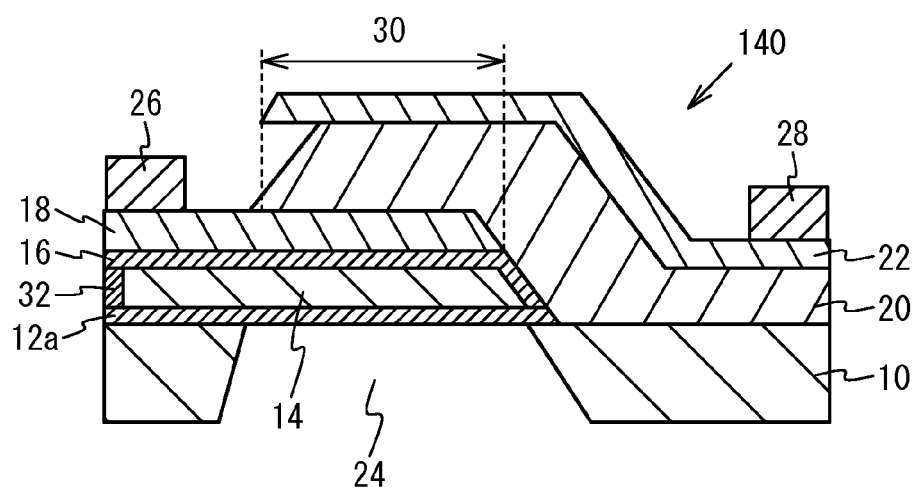

The first embodiment uses a metal film for the additional film, but a second embodiment uses an insulating film for the additional film. FIG. 5A and FIG. 5B are cross-sectional views illustrating piezoelectric thin film resonators in accordance with the second embodiment and a first variation of the second embodiment, respectively.

As illustrated in FIG. 5A, a piezoelectric thin film resonator 130 of the second embodiment includes an additional film 12a located under the silicon oxide film 14. The additional film 12a is an insulating film made of a material different from that of the silicon oxide film 14, and is, for example, a silicon nitride (SiN) film. Other structures are the same as those of the first variation of the first embodiment illustrated in FIG. 4A, and thus the description is omitted.

As demonstrated by the piezoelectric thin film resonator 130 of the second embodiment, the additional film 12a located under the silicon oxide film 14 is not limited to a metal film such as a Cr film, but may be an insulating film such as a SiN film. This configuration also prevents the silicon oxide film 14 from absorbing water, thus reducing the deterioration of the characteristics.

The additional film 12a made of an insulating film has better moisture resistance than the additional film 12 made of a metal film described in the first embodiment. Thus, the second embodiment can further prevent water absorption of the silicon oxide film 14 compared to the first embodiment when the additional film has the same thickness. In other words, the second embodiment enables to make the thickness of the additional film for preventing water absorption of the silicon oxide film 14 less.

In the piezoelectric thin film resonator 130 of the second embodiment, the insulating film 32 is located on the first side surface, which is not covered with the piezoelectric film 20, of the silicon oxide film 14. Accordingly, water absorption of the silicon oxide film 14 is further prevented, and the deterioration of the characteristics is further reduced.

In the piezoelectric thin film resonator 130 of the second embodiment, the additional film 12a is a SiN film, but may be other insulating film, and is preferably an insulating film having a higher moisture resistance than the silicon oxide film 14. Moreover, the additional film 12a is preferably an insulating film having a higher acoustic impedance than the silicon oxide film 14. For example, when the silicon oxide film 14 is made of a SiOF film, aluminum nitride (AlN) film and aluminum oxide ($Al_2O_3$) film are examples of the insulating film having a higher acoustic impedance than the SiOF film.

As illustrated in FIG. 5B, a piezoelectric thin film resonator 140 of the first variation of the second embodiment includes the non-oxygen-containing insulating film 16 located to extend to the second side surface, which is covered with the piezoelectric film 20, of the side surfaces of the silicon oxide film 14. Other structures are the same as those of the second embodiment illustrated in FIG. 5A, and thus the description is omitted.

The piezoelectric thin film resonator 140 of the first variation of the second embodiment includes the non-oxygen-containing insulating film 16 located to extend to the second side surface, which is covered with the piezoelectric film 20, of the silicon oxide film 14, thus preventing the piezoelectric film 20 from being oxidized by oxygen contained in the silicon oxide film 14.

Third Embodiment

Figure 6A:
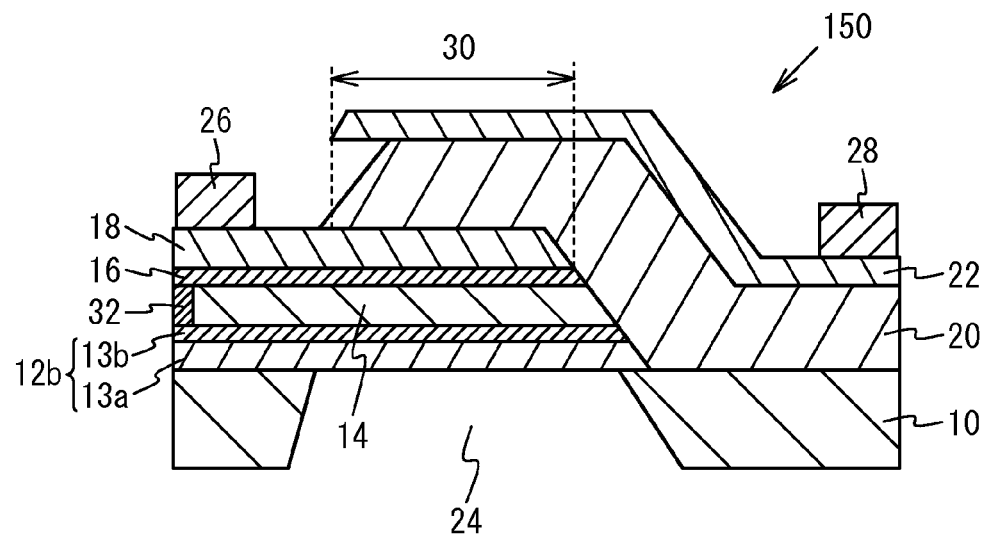
FIG. 6A and FIG. 6B are cross-sectional views illustrating piezoelectric thin film resonators in accordance with a third embodiment and a first variation of the third embodiment, respectively.
Figure 6B:
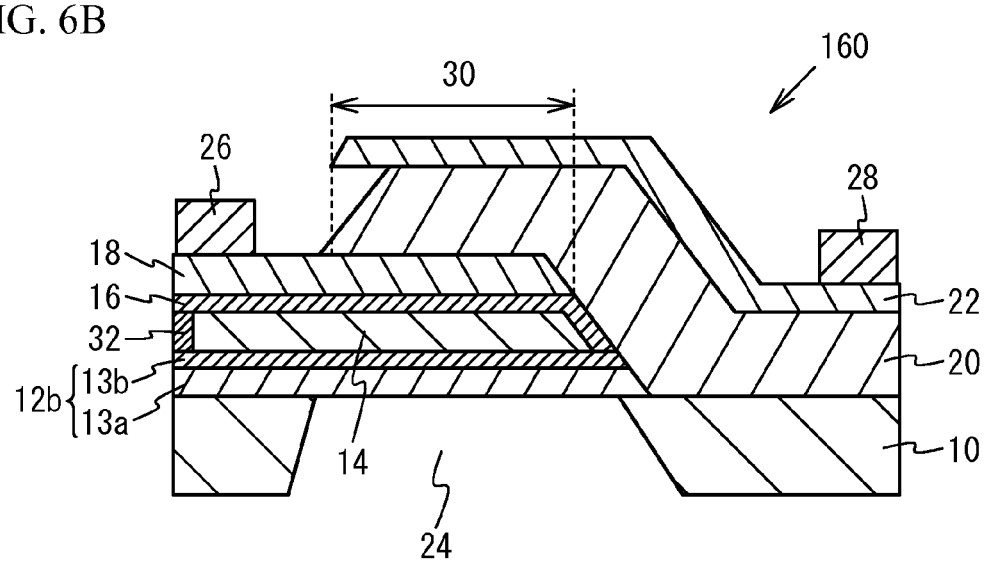

A third embodiment uses a multilayered film made of a metal film and an insulating film for the additional film. FIG. 6A and FIG. 6B are cross-sectional views illustrating piezoelectric thin film resonators in accordance with the third embodiment and a first variation of the third embodiment, respectively.

As illustrated in FIG. 6A, a piezoelectric thin film resonator 150 of the third embodiment includes an additional film 12b located under the silicon oxide film 14. The additional film 12b is a multilayered film formed by stacking a first film 13*a* made of a metal film and a second film 13*b* made of a non-oxygen-containing insulating film. The first film 13*a* is, for example, a Ru film, and the second film 13*b* is, for example, a silicon nitride (SiN) film. Other structures are the same as those of the first variation of the first embodiment illustrated in FIG. 4A, and thus the description is omitted.

As demonstrated by the piezoelectric thin film resonator 150 of the third embodiment, the additional film 12*b* may be a multilayered film formed by stacking the second film 13*b* made of a non-oxygen-containing insulating film and the first film 13*a* made of a metal film in this order from the silicon oxide film 14 side. This configuration can also prevent the silicon oxide film 14 from absorbing water, thus reducing the deterioration of the characteristics.

In the first embodiment, the additional film 12 made of a metal film may be oxidized by oxygen contained in the silicon oxide film 14, and the deterioration of the characteristics may occur. For example, when a Ru film, which is an easily oxidizable metal film, is used for the additional film 12, the deterioration of the characteristics due to oxidization easily occurs. On the other hand, the third embodiment uses a multilayered film formed by stacking the second film 13*b* made of a non-oxygen-containing insulating film and the first film 13*a* made of a metal film in this order from the silicon oxide film 14 side for the additional film 12*b*. Since the second film 13*b*, which is a non-oxygen-containing insulating film, is located between the silicon oxide film 14 and the first film 13*a*, which is a metal film, the oxidization of the first film 13*a* is prevented, and thus the deterioration of the characteristics is reduced.

In addition, the piezoelectric thin film resonator 150 of the third embodiment includes the insulating film 32 located on the first side surface, which is not covered with the piezoelectric film 20, of the silicon oxide film 14, thus further preventing the silicon oxide film 14 from absorbing water and further reducing the deterioration of the characteristics.

The piezoelectric thin film resonator 150 of the third embodiment uses a Ru film for the first film 13*a* of the additional film 12*b*, but may use other metal film such as Cr film. The third embodiment uses a SiN film for the second film 13*b* of the additional film 12*b*, but may use any non-oxygen-containing insulating film such as a nitride-based insulating film, including an aluminum nitride (AlN) film.

As illustrated in FIG. 6B, a piezoelectric thin film resonator 160 of the first variation of the third embodiment includes the non-oxygen-containing insulating film 16 located to extend to the second side surface, which is covered with the piezoelectric film 20, of the side surfaces of the silicon oxide film 14. Other structures are the same as those of the third embodiment illustrated in FIG. 6A, and thus the description is omitted.

The piezoelectric thin film resonator 160 of the first variation of the third embodiment includes the non-oxygen-containing insulating film 16 located to extend to the second side surface, which is covered with the piezoelectric film 20, of the silicon oxide film 14, thus preventing the piezoelectric film 20 from being oxidized by oxygen contained in the silicon oxide film 14.

Fourth Embodiment

Figure 7:
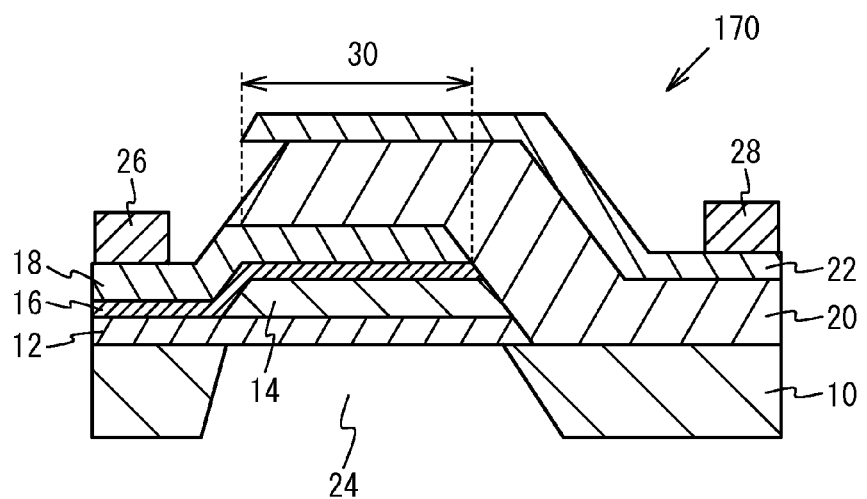
FIG. 7 is a cross-sectional view illustrating a piezoelectric thin film resonator in accordance with a fourth embodiment.

FIG. 7 is a cross-sectional view illustrating piezoelectric thin film resonator in accordance with a fourth embodiment. As illustrated in FIG. 7, in a piezoelectric thin film resonator 170 of the fourth embodiment, the silicon oxide film 14 located under the first electrode pad 26, which is located to make contact with the upper surface of the lower electrode 18, is removed, and the silicon oxide film 14 is not located under the first electrode pad 26. The non-oxygen-containing insulating film 16 located between the silicon oxide film 14 and the lower electrode 18 covers the side surface of the silicon oxide film 14, and extends to under the first electrode pad 26. Thus, the lower electrode 18 and the additional film 12 make no contact with each other, and fail to short out. Other structures are the same as those of the first embodiment illustrated in FIG. 1, and thus the description is omitted.

In the piezoelectric thin film resonator of the fourth embodiment, the silicon oxide film 14 is not located under the first electrode pad 26. This structure enables to remove the insulating film that increases electrical capacitance. Thus, unnecessary series capacitance is reduced, and thereby the deterioration of the characteristics is reduced.

Figure 8A:
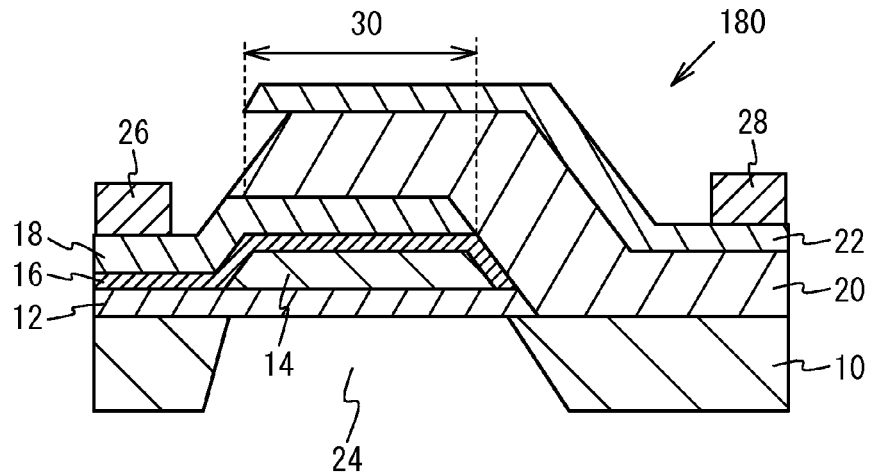
FIG. 8A through FIG. 8C are cross-sectional views illustrating piezoelectric thin film resonators in accordance with first through third variations of the fourth embodiment, respectively.
Figure 9A:
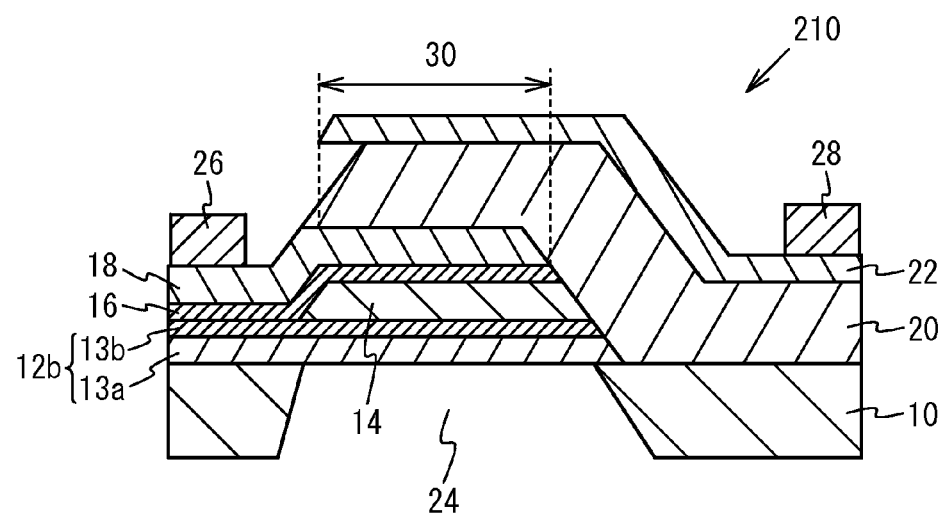
FIG. 9A and FIG. 9B are cross-sectional views illustrating piezoelectric thin film resonators in accordance with fourth and fifth variations of the fourth embodiment, respectively.
Figure 9B:
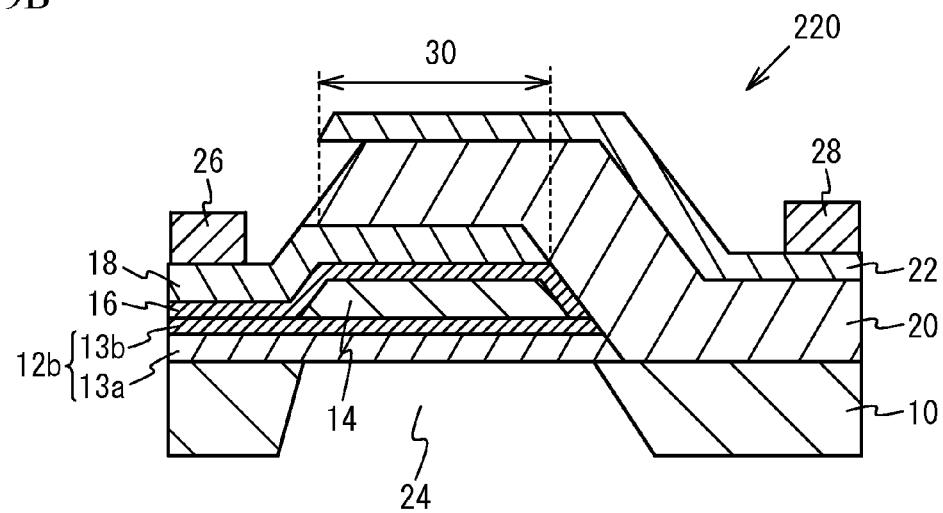

FIG. 8A thorough FIG. 9B are cross-sectional views illustrating piezoelectric thin film resonators in accordance with first through fifth variations of the fourth embodiment, respectively. As illustrated in FIG. 8A, a piezoelectric thin film resonator 180 of the first variation of the fourth embodiment includes the non-oxygen-containing insulating film 16 located to extend to the second side surface, which is covered with the piezoelectric film 20, of the side surfaces of the silicon oxide film 14. Other structures are the same as those of the fourth embodiment illustrated in FIG. 7, and thus the description is omitted.

The piezoelectric thin film resonator 180 of the first variation of the fourth embodiment includes the non-oxygen-containing insulating film 16 located to extend to the second side surface, which is covered with the piezoelectric film 20, of the silicon oxide film 14, thus preventing the piezoelectric film 20 from being oxidized by oxygen contained in the silicon oxide film 14.

Figure 8B:
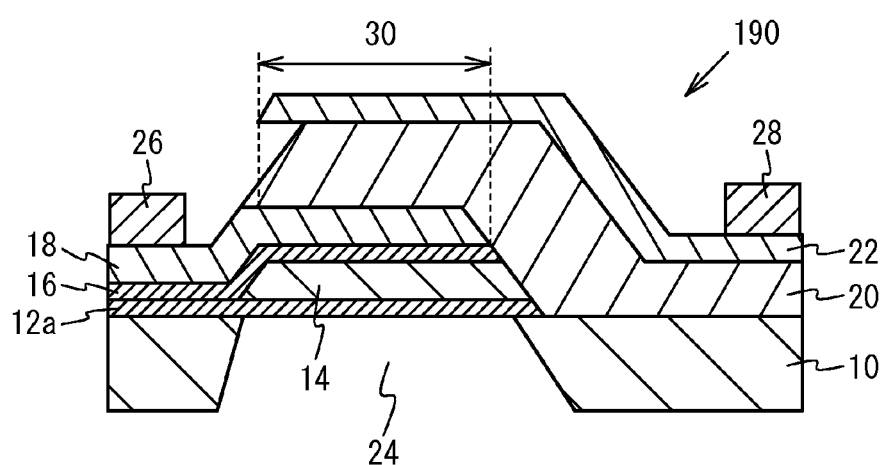

As illustrated in FIG. 8B, in a piezoelectric thin film resonator 190 of the second variation of the fourth embodiment, the additional film 12*a*, which is made of an insulating film made of a material different from that of the silicon oxide film 14, is located under the silicon oxide film 14 instead of the additional film 12 made of a metal film. Other structures are the same as those of the fourth embodiment illustrated in FIG. 7, and thus the description is omitted.

As demonstrated by the piezoelectric thin film resonator 190 of the second variation of the fourth embodiment, the additional film 12*a* may be an insulating film such as a silicon nitride film made of a material different from that of the silicon oxide film 14. This configuration can also prevent the silicon oxide film 14 from absorbing water, thus reducing the deterioration of the characteristics.

Figure 8C:
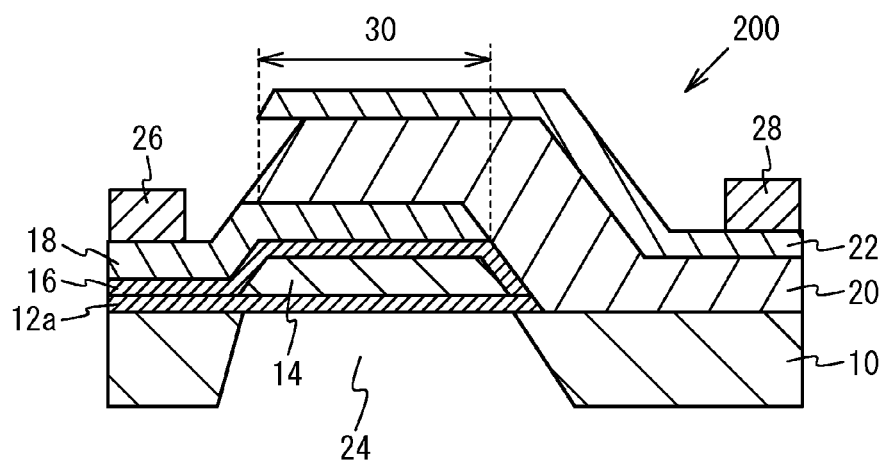

As illustrated in FIG. 8C, a piezoelectric thin film resonator 200 of the third variation of the fourth embodiment includes the non-oxygen-containing insulating film 16 located to extend to the second side surface, which is covered with the piezoelectric film 20, of the side surfaces of the silicon oxide film 14. Other structures are the same as those of the second variation of the fourth embodiment illustrated in FIG. 8B, and thus the description is omitted.

The piezoelectric thin film resonator 200 of the third variation of the fourth embodiment includes the non-oxygen-containing insulating film 16 located to extend to the second side surface, which is covered with the piezoelectric film 20, of the silicon oxide film 14, thus preventing the piezoelectric film 20 from being oxidized by oxygen contained in the silicon oxide film 14.

As illustrated in FIG. 9A, in a piezoelectric thin film resonator 210 of the fourth variation of the fourth embodiment, the additional film 12b is located under the silicon oxide film 14 instead of the additional film 12 made of a metal film. The additional film 12b is made of a multilayered film formed by stacking the first film 13a made of a metal film and the second film 13b made of a non-oxygen-containing insulating film. Other structures are the same as those of the fourth embodiment illustrated in FIG. 7, and thus the description is omitted.

As demonstrated by the piezoelectric thin film resonator 210 of the fourth variation of the fourth embodiment, the additional film 12b may be a multilayered film formed by stacking the second film 13b made of a non-oxygen-containing insulating film and the first film 13a made of a metal film in this order from the silicon oxide film 14 side. This configuration can also prevent the silicon oxide film 14 from absorbing water, thus reducing the deterioration of the characteristics. In addition, the provision of the second film 13b made of a non-oxygen-containing insulating film between the silicon oxide film 14 and the first film 13a prevents the oxidization of the first film 13a.

As illustrated in FIG. 9B, a piezoelectric thin film resonator 220 of the fifth variation of the fourth embodiment includes the non-oxygen-containing insulating film 16 located to extend to the second side surface, which is covered with the piezoelectric film 20, of the side surfaces of the silicon oxide film 14. Other structures are the same as those of the fourth variation of the fourth embodiment illustrated in FIG. 9A, and thus the description is omitted.

The piezoelectric thin film resonator 220 of the fifth variation of the fourth embodiment includes the non-oxygen-containing insulating film 16 located to extend to the second side surface, which is covered with the piezoelectric film 20, of the silicon oxide film 14, thus preventing the piezoelectric film 20 from being oxidized by oxygen contained in the silicon oxide film 14.

Fifth Embodiment

Figure 10A:
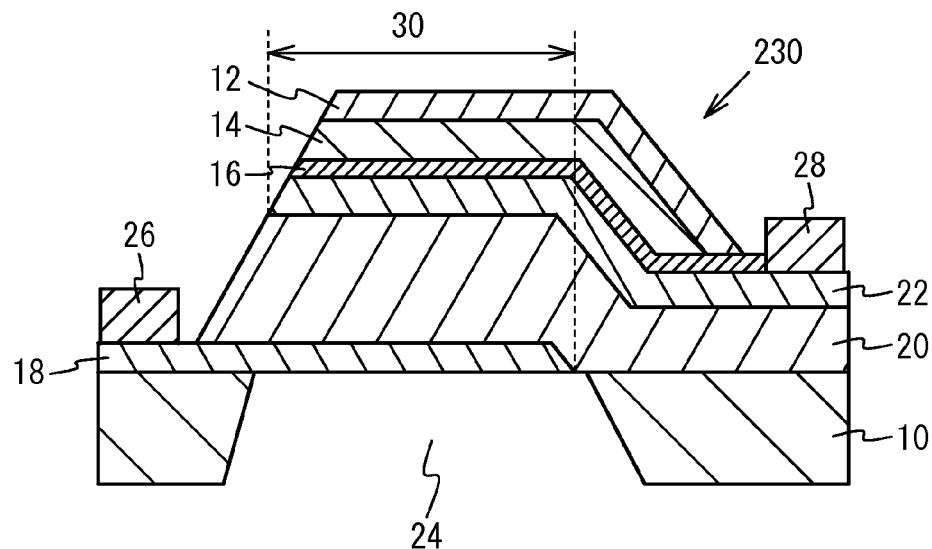
FIG. 10A and FIG. 10B are cross-sectional views illustrating piezoelectric thin film resonators in accordance with a fifth embodiment and a first variation of the fifth embodiment, respectively.
Figure 10B:
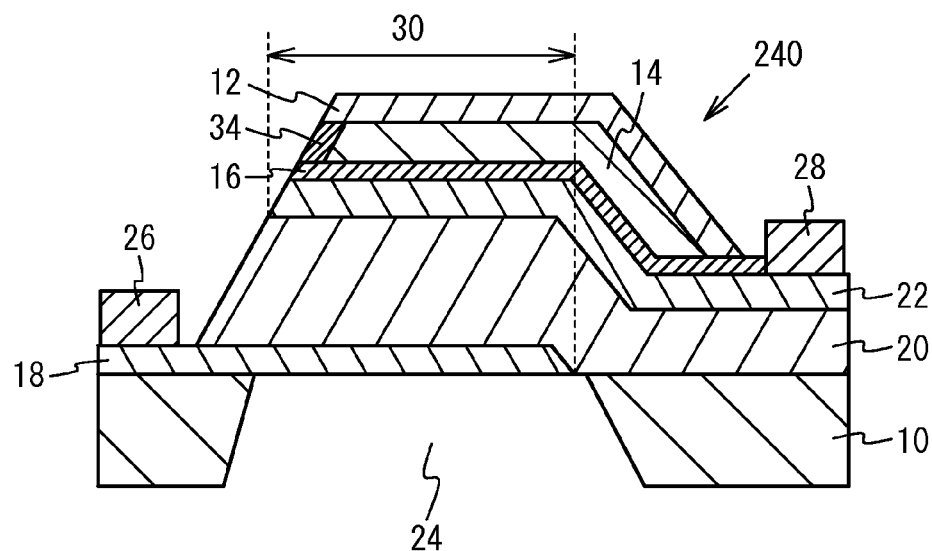

In the first through fourth embodiments, the additional film and the silicon oxide film are located at the opposite side of the lower electrode from the piezoelectric film. A fifth embodiment provides the additional film and the silicon oxide film at the opposite side of the upper electrode from the piezoelectric film. FIG. 10A and FIG. 10B are cross-sectional views illustrating piezoelectric thin film resonators in accordance with the fifth embodiment and a first variation of the fifth embodiment, respectively.

As illustrated in FIG. 10A, in a piezoelectric thin film resonator 230 of the fifth embodiment, the lower electrode 18 is located on the substrate 10. The lower electrode 18 is made of, for example, a Ru film, and the substrate 10 is made of, for example, a Si substrate. On the lower electrode 18 and the substrate 10, located is the piezoelectric film 20 made of, for example, an AlN film. On the piezoelectric film 20, located is the upper electrode 22 so as to have the resonance region 30 facing the lower electrode 18. The upper electrode 22 is made of, for example, a Ru film. The air-space 24 penetrating through the substrate 10 is formed so as to include the resonance region 30.

On the upper electrode 22, located is the non-oxygen-containing insulating film 16 made of, for example, a silicon nitride (SiN) film. On the non-oxygen-containing insulating film 16, located is the silicon oxide film 14 functioning as a temperature compensation film. The silicon oxide film 14 is, for example, a SiOF film. On the silicon oxide film 14, located is the additional film 12 made of, for example, a Cr film.

The first electrode pad 26 is located to make contact with the upper surface of the lower electrode 18, and the second electrode pad 28 is located to make contact with the upper surface of the upper electrode 22. The first electrode pad 26 and the second electrode pad 28 are, for example, gold (Au) pads.

In the piezoelectric thin film resonator 230 of the fifth embodiment, the non-oxygen-containing insulating film 16 is located between the silicon oxide film 14, which is located at the opposite side of the upper electrode 22 from the piezoelectric film 20, and the upper electrode 22. This structure prevents the upper electrode 22 from being oxidized by oxygen contained in the silicon oxide film 14. Moreover, the additional film 12 is located on the silicon oxide film 14, i.e., at the opposite side from the non-oxygen-containing insulating film 16. This structure prevents the silicon oxide film 14 from absorbing water. Accordingly, the piezoelectric thin film resonator 230 of the fifth embodiment reduces the deterioration of the characteristics.

To prevent the silicon oxide film 14 from absorbing water, the additional film 12 is preferably located across the entire upper surface of the silicon oxide film 14 and also on the side surface of the silicon oxide film 14.

As described in the first and fifth embodiments, the silicon oxide film 14 is required to be located at the opposite side of at least one of the lower electrode 18 and the upper electrode 22 from the piezoelectric film 20, and may be located at the opposite side of the lower electrode 18 from the piezoelectric film 20 and at the opposite side of the upper electrode 22 from the piezoelectric film 20.

As illustrated in FIG. 10B, a piezoelectric thin film resonator 240 of the first variation of the fifth embodiment includes an insulating film 34 located on a first side surface, which is not covered with the additional film 12, of the side surfaces of the silicon oxide film 14. The insulating film 34 is located, for example, across the entire first side surface, which is not covered with the additional film 12, of the silicon oxide film 14. The insulating film 34 is made of a material different from that of the silicon oxide film 14, and is made of, for example, a silicon nitride (SiN) film. Other structures are the same as those of the fifth embodiment illustrated in FIG. 10A, and thus the description is omitted.

The piezoelectric thin film resonator 240 of the first variation of the fifth embodiment includes the insulating film 34 located on the first side surface, which is not covered with the additional film 12, of the silicon oxide film 14. This structure further prevents the silicon oxide film 14 from absorbing water, thus further reducing the deterioration of the characteristics.

The insulating film 34 is preferably located across the entire first side surface, which is not covered with the additional film 12, of the silicon oxide film 14, but water absorption of the silicon oxide film 14 can be prevented as long as the insulating film 34 is located on at least a part of the first side surface, which is not covered with the additional film 12, of the silicon oxide film 14. Moreover, the insulating film 34 may be an insulating film other than a SiN film, and is preferably a film having a higher moisture resistance than the silicon oxide film 14.

Sixth Embodiment

Figure 11A:
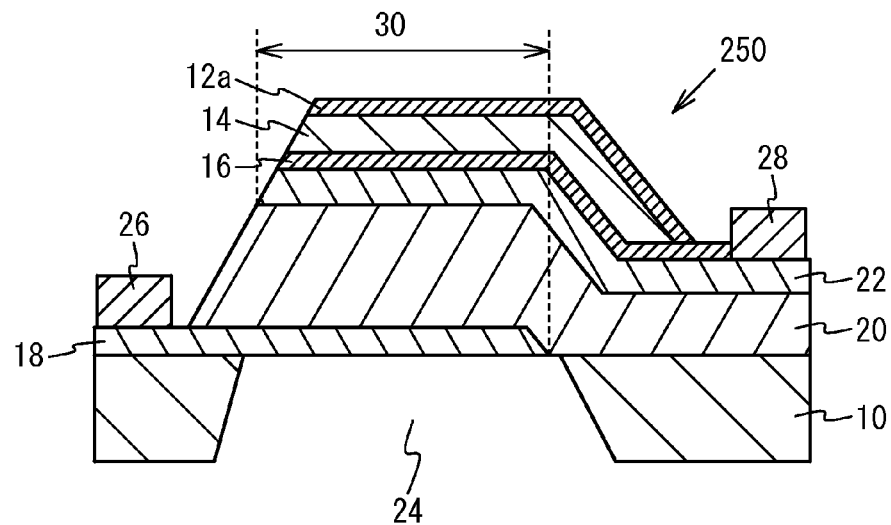
FIG. 11A and FIG. 11B are cross-sectional views illustrating piezoelectric thin film resonators in accordance with a sixth embodiment and a first variation of the sixth embodiment.
Figure 11B:
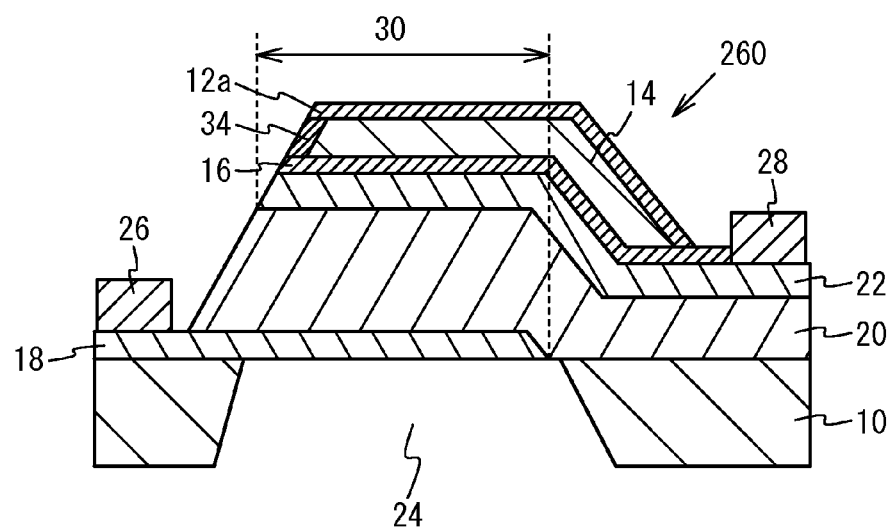

FIG. 11A and FIG. 11B are cross-sectional views illustrating piezoelectric thin film resonators in accordance with a sixth embodiment and a first variation of the sixth embodiment, respectively. As illustrated in FIG. 11A, in a piezoelectric thin film resonator 250 of the sixth embodiment, the additional film 12*a* located on the silicon oxide film 14 is an insulating film made of a material different from that of the silicon oxide film 14, and is, for example, a silicon nitride (SiN) film. Other structures are the same as those of the fifth embodiment illustrated in FIG. 10A, and thus the description is omitted.

As demonstrated by the piezoelectric thin film resonator 250 of the sixth embodiment, the additional film 12*a* located at the opposite side of the silicon oxide film 14 from the non-oxygen-containing insulating film 16 may be an insulating film such as a SiN film. This configuration can also prevent the silicon oxide film 14 from absorbing water, thus reducing the deterioration of the characteristics.

As illustrated in FIG. 11B, a piezoelectric thin film resonator 260 of the first variation of the sixth embodiment includes the insulating film 34 located on a first side surface, which is not covered with the additional film 12*a*, of the side surfaces of the silicon oxide film 14. Other structures are the same as those of the sixth embodiment illustrated in FIG. 11A, and thus the description is omitted.

The piezoelectric thin film resonator 260 of the first variation of the sixth embodiment includes the insulating film 34 located on the first side surface, which is not covered with the additional film 12*a*, of the silicon oxide film 14, thus further preventing the silicon oxide film 14 from absorbing water and further reducing the deterioration of the characteristics.

As described in the fifth and sixth embodiments, even when the silicon oxide film is located at the opposite side of the upper electrode from the piezoelectric film, the additional film 12*b* formed by stacking the second film 13*b* made of an insulating film and the first film 13*a* made of a metal film in this order from the silicon oxide film side may be used.

Seventh Embodiment

Figure 12A:
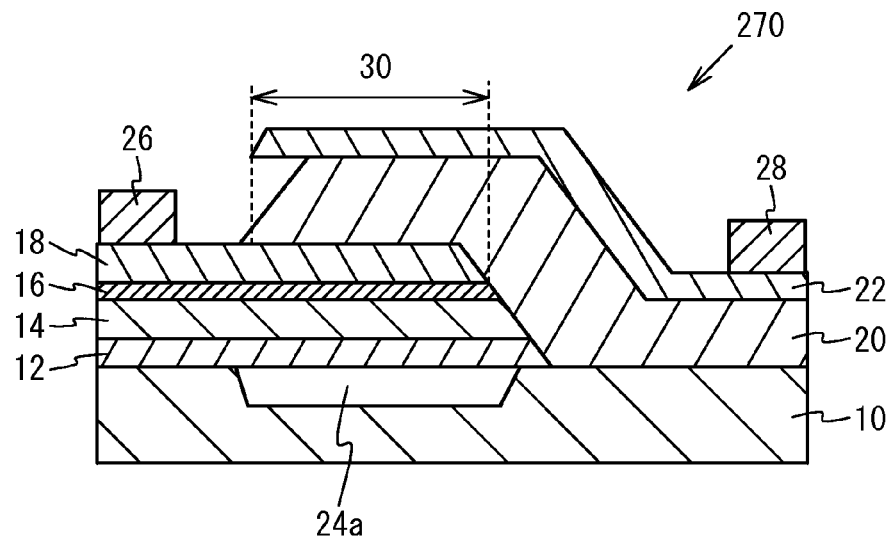
FIG. 12A and FIG. 12B are cross-sectional views illustrating piezoelectric thin film resonators in accordance with a seventh embodiment and a first variation of the seventh embodiment, respectively.
Figure 12B:
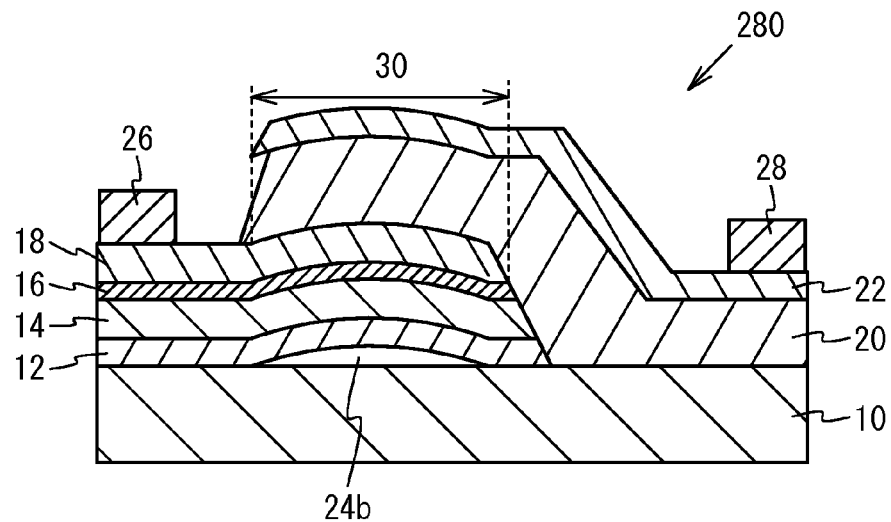

A seventh embodiment and a first variation of the seventh embodiment change the structure of the air-space. FIG. 12A and FIG. 12B are cross-sectional views illustrating piezoelectric thin film resonators in accordance with the seventh embodiment and the first variation of the seventh embodiment, respectively. As illustrated in FIG. 12A, in a piezoelectric thin film resonator 270 of the seventh embodiment, an air-space 24*a* formed in the substrate 10 in the resonance region 30 fails to penetrate through the substrate 10, and is formed as a recessed portion in the upper surface of the substrate 10. Other structures are the same as those of the first embodiment illustrated in FIG. 1, and thus the description is omitted.

As illustrated in FIG. 12B, in a piezoelectric thin film resonator 280 of the first variation of the seventh embodiment, an air-space fails to be formed in the substrate 10, but the additional film 12 is located on the substrate 10 so that an air-space 24*b* having a dome-shaped bulge is formed between the additional film 12 and the upper surface of the substrate 10. The dome-shaped bulge is a bulge having a shape in which the height of the air-space 24*b* is low in the periphery of the air-space 24*b* and the height of the air-space 24*b* increases at closer distances to the center of the air-space 24*b*. Other structures are the same as those of the first embodiment illustrated in FIG. 1, and thus the description is omitted.

In the piezoelectric thin film resonators of the seventh embodiment and the first variation of the seventh embodiment, the shape of the air-space 24 of the piezoelectric thin film resonator of the first embodiment is changed to the shapes of the air-spaces 24*a*, 24*b*. However, the air-spaces 24 of the piezoelectric thin film resonators, which are described in the first variation of the first embodiment through the first variation of the sixth embodiment, may be changed to the air-spaces 24*a*, 24*b* described in the seventh embodiment and the first variation of the seventh embodiment.

Eighth Embodiment

Figure 13:
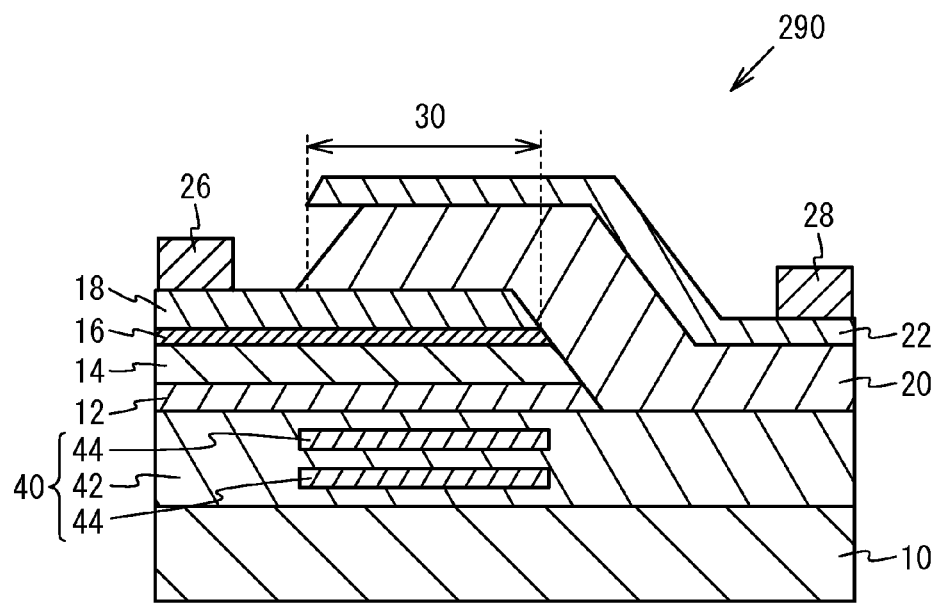
FIG. 13 is a cross-sectional view illustrating a piezoelectric thin film resonator in accordance with an eighth embodiment.

An eighth embodiment provides an acoustic mirror instead of the air-space. FIG. 13 is a cross-sectional view illustrating a piezoelectric thin film resonator in accordance with the eighth embodiment. As illustrated in FIG. 13, a piezoelectric thin film resonator 290 of the eighth embodiment includes an acoustic mirror 40 located on the lower surface of the additional film 12 in the resonance region 30. The acoustic mirror 40 reflects acoustic waves propagating through the piezoelectric film 20, and is formed by alternately stacking a film 42 with a low acoustic impedance and a film 44 with a high acoustic impedance. The film 42 with a low acoustic impedance and the film 44 with a high acoustic impedance have film thicknesses of $\lambda/4$ ($\lambda$ is the wavelength of the acoustic wave). The number of stacking layers of the film 42 with a low acoustic impedance and the film 44 with a high acoustic impedance can be freely selected. The additional film 12 and the silicon oxide film 14 have film thicknesses sufficiently less than $\lambda/4$, thus failing to function as acoustic mirrors. Other structures are the same as those of the first embodiment illustrated in FIG. 1, and thus the description is omitted.

In the piezoelectric thin film resonator of the eighth embodiment, the acoustic mirror 40 is provided instead of the air-space 24 of the piezoelectric thin film resonator of the first embodiment. The acoustic mirror 40 may be provided to the piezoelectric thin film resonator of the first variation of the first embodiment through the first variation of the sixth embodiment instead of the air-space 24.

As described above, the piezoelectric thin film resonator may have an FBAR structure designed to have the air-space 24 or 24*b* located under the lower electrode 18 in the resonance region 30 as demonstrated by the first embodiment through the first variation of the seventh embodiment. As demonstrated by the eighth embodiment, the piezoelectric thin film resonator may have a Solidly Mounted Resonator (SMR) structure designed to have the acoustic mirror 40 under the lower electrode 18 in the resonance region 30.

Ninth Embodiment

Figure 14:
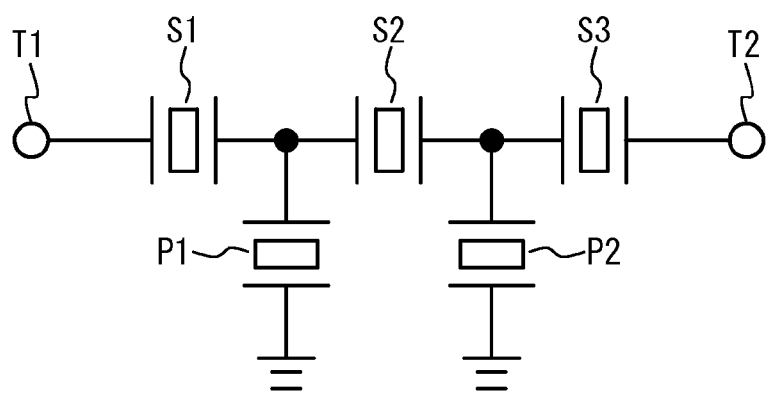
FIG. 14 is a circuit diagram of a ladder-type filter in accordance with a ninth embodiment.

A ninth embodiment uses any one of the piezoelectric thin film resonators of the first embodiment through the eighth embodiment for a filter. FIG. 14 is a circuit diagram of a ladder-type filter in accordance with the ninth embodiment. As illustrated in FIG. 14, the ladder-type filter includes one or more series resonators S1 through S3 and one or more parallel resonators P1 through P2. The series resonator S1 through S3 are connected in series between input/output terminals T1 and T2. The parallel resonator P1 through P2 are connected in parallel between the input/output terminals T1 and T2. At least one of the series resonators Si through S3 and the parallel resonators P1 through P2 may be any one of the piezoelectric thin film resonators of the first embodiment through the eighth embodiment.

Although the embodiments of the present invention have been described in detail, it is to be understood that the various change, substitutions, and alterations could be made hereto without departing from the spirit and scope of the invention.

What is claimed is:

1. An acoustic wave device comprising:
   a substrate;
   a piezoelectric film located on the substrate;
   a lower electrode and an upper electrode facing each other across at least a part of the piezoelectric film;
   a silicon oxide film located at an opposite side of at least one of the lower electrode and the upper electrode from the piezoelectric film;
   a non-oxygen-containing insulating film located between the at least one of the lower electrode and the upper electrode and the silicon oxide film; and
   an additional film located at an opposite side of the silicon oxide film from the non-oxygen-containing insulating film and made of a material different from a material of the silicon oxide film.

2. The acoustic wave device according to claim 1, further comprising:
   an insulating film located on a first side surface of side surfaces of the silicon oxide film and made of a material different from a material of the silicon oxide film, the first side surface being not covered with the piezoelectric film or the additional film.

3. The acoustic wave device according to claim 1, wherein
   the silicon oxide film is located at an opposite side of the lower electrode from the piezoelectric film, and
   the non-oxygen-containing insulating film extends to a second side surface of the side surfaces of the silicon oxide film, the second side surface being covered with the piezoelectric film.

4. The acoustic wave device according to claim 1, wherein
   the non-oxygen-containing insulating film has a film thickness less than a film thickness of the silicon oxide film.

5. The acoustic wave device according to claim 1, further comprising:
   an electrode pad located to make contact with an upper surface of the lower electrode,
   wherein the silicon oxide film is located at an opposite side of the lower electrode from the piezoelectric film, and
   the silicon oxide film is not located under the electrode pad.

6. The acoustic wave device according to claim 1, wherein
   the additional film includes a film having an acoustic impedance greater than an acoustic impedance of the silicon oxide film.

7. The acoustic wave device according to claim 1, wherein
   the non-oxygen-containing insulating film is a silicon nitride film or an aluminum nitride film.

8. The acoustic wave device according to claim 1, wherein
   the additional film is made of an insulating film.

9. The acoustic wave device according to claim 1, wherein
   the additional film is made of a metal film.

10. The acoustic wave device according to claim 1, wherein
    the additional film is made of a multilayered film formed by stacking a non-oxygen-containing insulating film and a metal film in this order from a side of the silicon oxide film.

11. The acoustic wave device according to claim 1, wherein
    the silicon oxide film is a silicon oxide film doped with fluorine.

* * * * *